(12) United States Patent
Kobayashi et al.

(10) Patent No.: US 6,361,667 B1
(45) Date of Patent: *Mar. 26, 2002

(54) IONIZATION SPUTTERING APPARATUS

(75) Inventors: Masahiko Kobayashi, Kanagawa; Hajime Sahase, Tokyo; Nobuyuki Takahashi, Kanagawa, all of (JP)

(73) Assignee: Anelva Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,482

(22) Filed: Mar. 16, 1998

(30) Foreign Application Priority Data

Mar. 18, 1997 (JP) .............................. 9-085705

(51) Int. Cl.⁷ .............................. C23C 14/35
(52) U.S. Cl. .............................. 204/298.11; 204/298.06; 204/298.16
(58) Field of Search ........................ 204/298.11, 298.16, 204/298.17, 298.15, 298.06, 298.19, 298.34, 398.37

(56) References Cited

U.S. PATENT DOCUMENTS

| | | | | |
|---|---|---|---|---|
| 3,530,057 A | * | 9/1970 | Muly, Jr. ............... | 204/298.06 |
| 4,853,102 A | * | 8/1989 | Tateishi et al. ......... | 204/298.16 |
| 4,871,433 A | | 10/1989 | Wagner et al. ......... | 204/192.12 |
| 4,960,753 A | * | 10/1990 | Collins et al. ................. | 505/1 |
| 5,006,219 A | | 4/1991 | Latz et al. ............. | 204/298.16 |
| 5,026,470 A | * | 6/1991 | Bonyhard et al. ...... | 204/298.19 |
| 5,085,755 A | * | 2/1992 | Setoyama et al. ..... | 204/298.16 |
| 5,178,739 A | * | 1/1993 | Barnes et al. .......... | 204/298.06 |
| 5,215,638 A | | 6/1993 | Häusler ................. | 204/192.12 |
| 5,308,417 A | * | 5/1994 | Groechel et al. ...... | 204/192.12 |
| 5,346,600 A | * | 9/1994 | Nieh et al. .............. | 204/298.06 |
| 5,439,574 A | * | 8/1995 | Kobayashi et al. .... | 204/298.19 |
| 5,455,197 A | * | 10/1995 | Ghanbari et al. ........ | 204/298.2 |
| 5,478,459 A | * | 12/1995 | Latz ....................... | 204/298.19 |
| 5,518,593 A | * | 5/1996 | Hosokawa et al. .... | 204/192.12 |
| 5,538,603 A | * | 7/1996 | Guo ...................... | 204/192.12 |
| 5,630,916 A | * | 5/1997 | Gerrish et al. ......... | 204/298.16 |
| 5,690,795 A | * | 11/1997 | Rosenstein et al. ...... | 204/192.1 |
| 5,807,467 A | | 9/1998 | Givens et al. .......... | 204/192.12 |
| 5,968,327 A | * | 10/1999 | Kobayashi et al. .... | 204/298.11 |
| 6,077,403 A | * | 6/2000 | Kobayashi et al. .... | 204/192.12 |

FOREIGN PATENT DOCUMENTS

| | | |
|---|---|---|
| JP | 57-198635 | 12/1982 |
| JP | 1-111872 | 4/1989 |

OTHER PUBLICATIONS

Vossen et al., "Thin Film Processes", pp. 148152, and 153, Dec. 1978.*
"Magnetron Sputter Deposition for Interconnect" by S.M. Rossnagel, Conference Proceedings ULSI XI 1996 Materials Research Society (pp. 227–232).
"Ionized Magnetron Sputtering for Lining and Filling Trenches and Vias" by S.M. Rossnagel, Semiconductor International, Feb. 1996 (pp. 99–102).

* cited by examiner

*Primary Examiner*—Nam Nguyen
*Assistant Examiner*—Steven H. VerSteeg
(74) *Attorney, Agent, or Firm*—Armstrong, Westerman & Hattori, LLP (57) ABSTRACT

This invention discloses ionization sputtering apparatuses which have a function for ionizing sputtered particles. Those apparatuses comprise an ionization means for ionizing sputtered particles from a target. The ionization means generates a plasma by applying radio frequency energy with plasma generation gas at an ionization space between the target and a holder holding a substrate. An disclosed apparatus comprises a magnetic device preventing the plasma from diffusing from the ionization space. Another disclosed apparatus comprises a magnetic device which orients the ionized sputtered particles toward the substrate.

10 Claims, 6 Drawing Sheets

IONIZATION SPUTTERING APPARATUS

BACK GROUND OF THE INVENTION

1. Field of the Invention

This invention relates to a sputtering apparatus used for fabrication of various kinds of semiconductor devices, especially to an ionization sputtering apparatus which has a function for ionizing sputtered particles.

2. Description of Prior Art

In fabrication of semiconductor devices, sputtering process is widely utilized for depositions of many kinds of films such as wiring metal films and barrier films preventing cross-diffusion of dissimilar layers. In various properties of sputtering apparatuses, high step coverage onto a hole formed on a substrate has been more significant recently.

Specifically, in the structure of CMOS-FET (complementary metal-oxide-semiconductor field effect transistor), which is broadly used in DRAM (dynamic random access memory), a barrier film is deposited onto a contact hole formed above a channel so that the cross-contamination of contact metal and the channel material. In multi-layer wiring structures, a via hole is formed through an inter-layer insulation film and is filled with inter-layer wiring metal. A barrier film is also formed on the surface of the via hole for prevention of cross-contamination. Aspect ratio, which means ratio of hole depth against hole width, of these holes has been higher and higher by years on the ground that integration scales of devices have been increased. For example, the aspect ratio rises up to about 5 or 6 in 256 Mbit class DRAM, though it is about 4 in 64 Mbit class DRAM.

In deposition of the barrier film onto a hole such as a contact hole or via hole, amount of deposition on the bottom surface of the hole needs to be to 10 to 15% of that on the surface outside the hole. It is, however, difficult to deposit a film onto a hole having a high aspect ratio at high bottom coverage. Bottom coverage means proportion of a deposition rate onto the bottom of a hole against that onto the outside of holes. When the bottom coverage is decreased in the barrier film deposition, crucial defects such as the junction leak which affect device properties might occur, because the barrier film is thinner at the bottom.

As a method for improving the bottom coverage, such a method as collimate sputtering and low-pressure long-distance (LPLD) sputtering have been developed. The collimate sputtering is the method to make sputtered particles flying vertically to a substrate arrive at the substrate selectively, by providing between the target and the substrate a board called "collimator" having many through holes elongated vertically to the substrate. The LPLD sputtering is the method to make sputtered particles flying vertically to a substrate arrive at the substrate selectively, by enlarging the distance from the target to the substrate up to about the 3 to 5 times of that in usual sputtering, and reducing the pressure, for example below 0.8 mTorr, to enlarge the mean free path so that those sputtered particles may not collide with each other to scatter away.

The collimate sputtering, however, has a problem that the sputter rate is decreased because sputtered particles are wastefully deposited on the collimator. The LPLD sputtering also has the problem of the sputter rate decreasing. For the LPLD sputtering, it is essential because the pressure is reduced and the target-substrate distance is enlarged. Because of these problems, it is a fact that the collimate sputtering can not be used for processes further than the mass production of devices up to 16 Mbit class having holes of aspect ratios up to about 3. The LPLD sputtering is supposed to have the limitation at the aspect ratio about 4 as well.

SUMMARY OF THE INVENTION

Considering the situation described above, this invention is given an object to enable a high step coverage thin-film deposition onto a hole with an aspect ratio over 4.

To achieve this object, this invention presents an ionization sputtering apparatus, wherein an ionization means generates a plasma at an ionization space between a target and a holder holding a substrate, and a magnetic device preventing the plasma from diffusing from the ionization space is provided.

To achieve this object as well, this invention presents an ionization sputtering apparatus, wherein an ionization means generates a plasma at an ionization space between a target and a holder holding a substrate, and a magnetic device orienting ionized sputtered particles toward the substrate is provided.

PREFERRED MODES OF THE INVENTION

Preferred modes of the invention will be described as follows.

Figure 1:
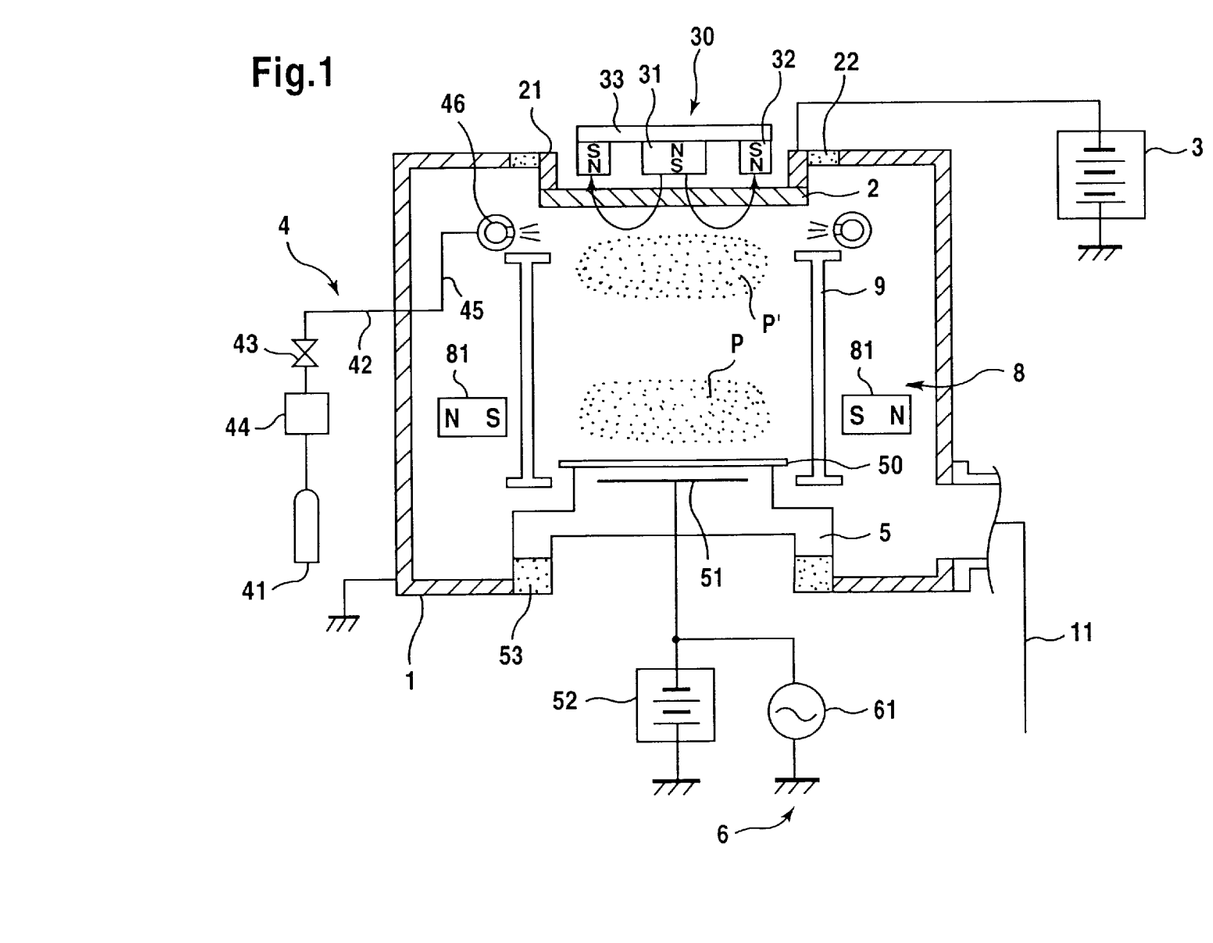
FIG. 1 shows a schematic front view of an ionization sputtering apparatus of the first mode.

FIG. 1 shows a schematic front view of an ionization sputtering apparatus of the first mode. The apparatus shown in FIG. 1 is one for carrying out the ionization sputtering. The ionization sputtering is the method to make sputtered particles incident vertically to a hole on a substrate by ionizing sputtered particles and utilizing an effect of such ionized sputtered particles. The ionization sputtering brings much higher bottom coverage than the collimate sputtering and the LPLD sputtering.

Specifically, the apparatus of the first mode comprises a sputter chamber 1 having a pumping system 11, target 2 provided in sputter chamber 1, sputter source 3 for causing a sputter discharge on target 2, gas introduction means 4 for introducing a gas into sputter chamber 1, ionization means 6 for ionizing sputtered particles from target 2, a holder 5 for holding a substrate 50 at a place where ionizes sputtered particles arrive, and, magnetic device 8 for restraining a plasma from diffusing to the wall of sputter chamber 1.

Sputter chamber 1 is an air-tight vessel having a gate valve (not shown). Sputter chamber 1 is made of metal such as stainless steel and is kept at the earth potential. Pumping system 11 is a multi-stage evacuation system equipped with two or more vacuum pumps such as a combination of a turbo-molecular pump and a diffusion pump. Pumping system 11 can pump sputter chamber 1 to about $10^{-8}$ Torr. Pumping system 11 has a pumping speed controller such as a variable orifice in order to control the pumping speed adequately.

Target 2 is a disk with 6 mm in thickness and 300 mm in diameter, for example. Target 2 is mounted by a target holder 21 with sputter chamber 1, interposing an insulation block 22. Behind target 2, magnetic device 30 for the magnetron discharge is provided. Magnetic device 30 is composed of a center magnet 31, an outer magnet 32 surrounding center magnet 31 and a yoke 33 connecting center magnet 31 and outer magnet 32. Though magnets 31,32 are permanent magnets, those may be electromagnets. Sputter source 3 is to apply a negative dc voltage for the sputter discharge with target 2. For example, in case the titanium film deposition, −500V is applied with target 2 made of titanium. When the negative dc voltage is applied with target 2, target 2 is bombarded with positive ions, emitting secondary electrons with sputtered particles. As a result, the sputter discharge is created. In such a particular way as the sputter deposition of dielectric, a RF source is employed as sputter source 3.

Gas introduction means 4 comprises a gas bomb 41 in which a gas for the sputter discharge such as argon is stored, introduction pipe 42 interconnecting gas bomb 41 and sputter chamber 1, valve 43 and mass flow controller 44 provided on introduction pipe, in-chamber pipe 45 connected with the end of introduction pipe 42, gas distributor 46 connected with in-chamber pipe 45. Gas distributor 46 is a round ring with gas effusing holes formed at its inner side. The gas effuses from each effusing holes to be introduced to a space between target 2 and holder 5 uniformly.

Ionization means 6 is, in this mode, composed so as to generate a radio frequency (RF) plasma at an ionization space located on the flying route of sputtered particles from target 2 to substrate 50. Specifically, Ionization means 6 comprises a RF source 61 connected with holder 5. RF source 61 is, for example, 13.56 MHz and 200W. A matching box (not shown) is provided on the RF line interconnecting holder 5 and RF source 61. An electric field is applied at the ionization space by RF source 61. The gas introduced by gas introduction means 4 transits to a plasma (designate by "P" in FIG. 1) by the energy of the electric field.

Sputtered particles, which are usually atoms, out of Target 2 collide with an electron or ion to be ionized when they pass through the plasma P. These ionized sputtered particles are accelerated by an electric field as described after, thus arriving at substrate 50.

Holder 5 is provided air-tightly with sputter chamber 1, interposing insulation block 53. Holder 5 holds substrate 50 in parallel to target 2. An electrostatic chucking mechanism for chucking substrate 50 by electrostatic charges is provided. The electrostatic chucking mechanism comprises a chucking electrode 51 provided in holder 5 and a chucking source 52 applying a dc voltage with chucking electrode 51. A heater (not shown) is provided in holder 5 in order to heat substrate 50 to make the deposition more efficient, if necessary.

RF source 61 in ionization means 6 also has the function as a self-bias source which gives a negative self-bias potential with substrate 50 by applying the RF voltage with holder 5.When the RF voltage is applied with substrate 50 by RF source 61, charged particles in the plasma P are accelerated periodically to the surface of substrate 50. In this acceleration, the number of electrons collected at the surface of substrate 50 is much more than that of positive ions, because the mobility of the electron is much higher than the ion. As a result, the surface state of substrate 50 is the same as biased with a negative potential. This is called a "self-bias potential". Specifically, when the described example of RF source 61 is used, the self-bias potential of −30V to −100V on the average is given with substrate 50.

When the self-bias potential as described is given with substrate 50, the space adjacent to the surface of substrate 50 is the same as the cathode sheath in the diode dc discharge. An electric field having a gradient where potential decreases toward substrate 50, which is hereafter called "extraction electric field", is applied with the space. By this extraction field the ionized sputtered particles are extracted from the plasma and arrive substrate 50 efficiently.

The apparatus of this mode has a deposition shield 9 preventing sputtered particles from arriving at unnecessary places in sputter chamber 1. Deposition shield 9 is cylindrical and provided surrounding a space between target 2 and holder 5. If the sputtered particles arrive at an unnecessary place such as a wall surface of sputter chamber 1, they are deposited to build up an undesired thin film. When this thin film grows to be thick enough, factors such as the inside stress make the film peels off. The peeling film may produce particles drifting in sputter chamber 1. If those particles reach at substrate 50, defects such as local abnormal thickness of the film is created on substrate 50. This is why the apparatus of this mode has deposition shield 9 surrounding the space between target 2 and holder 5 so as to prevent sputtered particles from arriving at unnecessary places. The inner surface of deposition shield 9 is made uneven by a roughening treatment such as the blasting so that the deposited film is hard to peel off.

Figure 2:
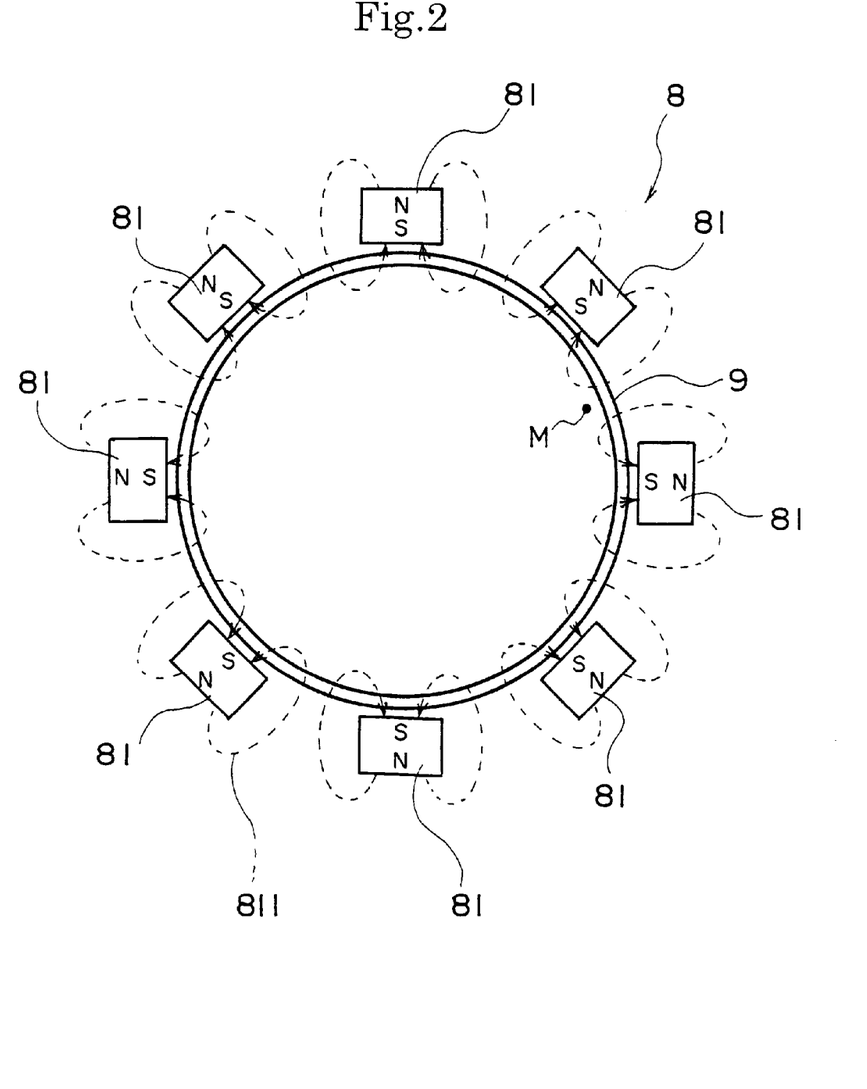
FIG. 2 shows a schematic plane view of magnetic device 5 shown in FIG. 1.

Next will be described magnetic device 8 characterizing the apparatus of this mode. FIG. 2 shows a schematic plane view of magnetic device 5 appearing in FIG. 1. Magnetic device 8 comprises plural permanent magnets 81. Each permanent magnet 81 is rectangular parallelepiped shaped and located outside deposition shield 9, being apart with the same distance from each other. In case deposition shield is 300 mm in outer diameter, eight permanent magnets 81 are provided being apart with 50 mm from each other. The inner surface of each permanent magnet 81, which is faced to the ionization space, is the S pole, and the outer surface opposite to the inner surface of each permanent magnet 81 is the N pole. Therefore, magnetic lines 811 as in the cusp magnetic field are applied through deposition shield 9. Deposition shield 9 is made of material such as stainless steel or aluminum. called "intermediate region", the plasma diffusing prevention is enabled by a phenomenon that electrons can hardly cross magnetic lines 811. In the intermediate regions, magnetic lines 811 are crossed to diffusing directions of the plasma adjacent to the inner surface of deposition shield 9. On the other hand, the inner region to each permanent magnet 81, which are hereafter called "magnetic region", the plasma diffusing prevention is enabled by a phenomenon similar to the mirror magnetic field. In the magnetic regions, magnetic lines 811 are collected from both sides and get more dense at positions more adjacent to permanent magnets 81. The configuration of magnetic lines 811 is the same as in the mirror magnetic field, where charged particles flying toward permanent magnets 81 turn back to the plasma. By this phenomena, the plasma is prevented from diffusing to the walls of deposition shield 9 and sputter chamber 1.

By the plasma diffusing prevention as described, the high-density plasma can be maintained at the ionization space because the loss of the plasma at the walls of deposition shield 9 and sputter chamber 1 is restrained. The location of permanent magnets 81 is notably significant from a point of view maintaining the high-density plasma. This location depends on the frequency of RF source 61. In case the frequency is 13.56 MHz, permanent magnets 81 are located about 200~30 cm higher than the surface of substrate 50. Taking an example of the magnetic field intensity, it is preferable to apply the magnetic field of 200~300 gauss at the position, which is designated by "M" in FIG. 2, 50 mm inner from the midpoint between of two permanent magnets 81.

Next will be described an operation of the ionization sputtering apparatus of this mode. Substrate 50 is transferred into sputter chamber 1 through the gate valve (not shown) and placed on holder 5. Sputter chamber 1 is pumped to $10^{-8}$ Torr in advance. After placing substrate 50, gas introduction means 4 is operated to introduce a process gas such as argon at a controlled flow rate. This process gas is for the plasma generation at the ionization space as well as for the sputter discharge. Controlling the pressure in sputter chamber 1 by the pumping speed controller of pumping system 11, sputter source 3 is operated. As a result, the sputter discharge is ignited, thus generating a plasma P' beneath target 2. At the same time, ionization means 6 is operated, that is, the RF field is applied by RF source 61. The process gas diffuses to the ionization space. The process gas is ionized at the ionization space, transiting to another plasma P. As described, the extraction electric field is applied by the self-bias potential given with substrate 50.

Sputtered particles from target 2 fly toward substrate 50. On that way, the sputtered particles are ionized when they pass through the plasma P. The ionized sputtered particles are extracted from the plasma P, thus efficiently arriving at substrate 50. The sputtered particles incident into a hole formed on substrate 50 are deposited on the bottom and the side wall, covering the hole sufficiently. After the time necessary for the deposition with the designed film thickness has passed, operations of ionization means 6, sputter source 3 and gas introduction means 4 are stopped, and substrate 50 is transferred out of sputter chamber 1. In case of the barrier film deposition, titanium film is deposited first introducing argon as the process gas. Next, the process gas is switched to nitrogen and titanium nitride film is deposited utilizing the reaction of titanium and nitrogen.

In the above described operation of the apparatus, the plasma P at the ionization space is much dense because the diffusion of the plasma is prevented by magnetic device 8. Therefore, the ionization of the sputtered particles in the plasma P is highly efficient. And, so much number of sputtered particles are ionized to be extracted to substrate 50. As a result, high efficiency of the sputter deposition is obtained. Inventors measured the ionization efficiency in the apparatus of this mode. It was turn out to be in the vicinity of 65%.

The pressure in sputter chamber 1 is preferably kept in the region of 10 mTorr to 100 mTorr. If it is below 10 mTorr, the ionization of the sputtered particles are insufficient because decrease of the plasma density is caused by the shortage of the process gas. On the other hand, if it is over 100 mTorr, there is a problem that the deposition rate and the bottom coverage are decreased because the sputtered particles are scattered away by a large number of the process gas molecular, though the ionization efficiency is enhanced by the higher-density plasma.

Figure 3:
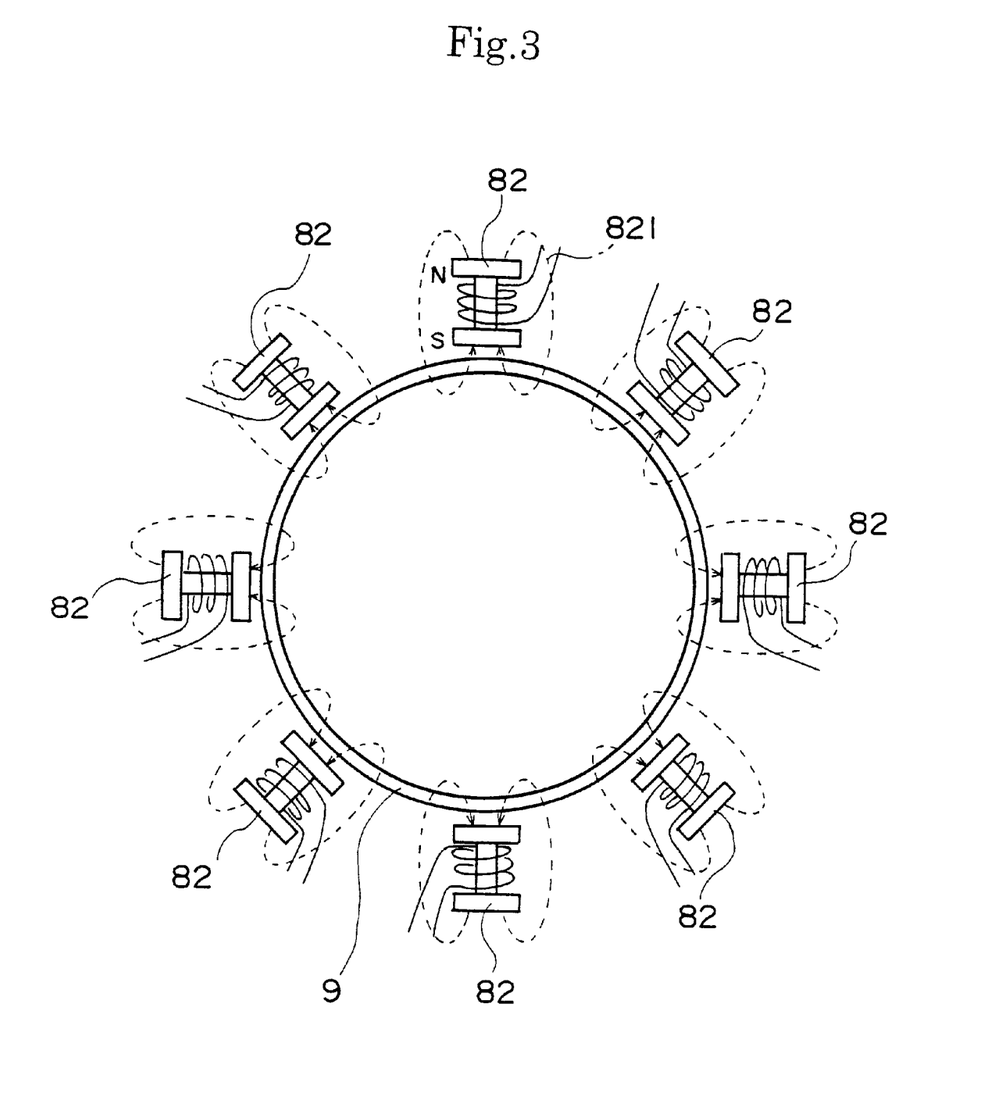
FIG. 3 shows a schematic plane view of the main part of an ionization sputtering apparatus of the second mode.

Next will be described the second mode of the invention. FIG. 3 shows a schematic plane view of the main part of an ionization sputtering apparatus of the second mode. The apparatus of this mode uses electromagnets 82 instead of permanent magnets 81 in the first of mode shown in FIG. 2. Each electromagnet 82 is provided at the same position as permanent magnet 81. Axis of each electromagnet 82 is directed to the center of sputter chamber 1.

In the apparatus of this mode as well, cusp-field-like magnetic lines 821 shown in FIG. 3 are applied through deposition shield 9 by each electromagnet 82. Each magnetic line 821 have a component vertical to the plasma diffusion directions from the ionization space. The ionization space is surrounded by these components. Therefore, the plasma is prevented from diffusing from the ionization space to deposition shield 9 or the wall of sputter chamber 1 as well as in the first mode. As a result, the effect of the ionization sputtering is enhanced as well.

Figure 4:
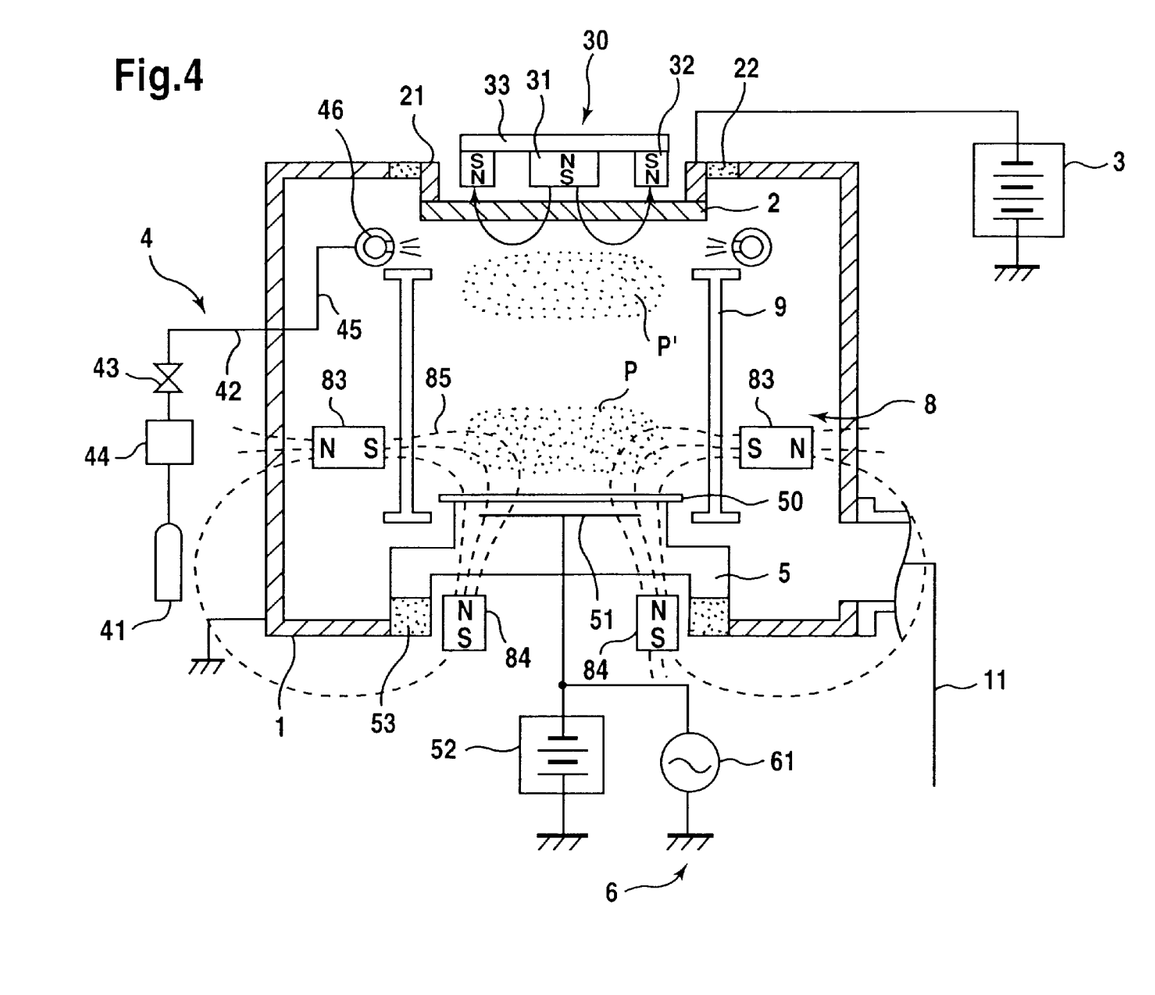
FIG. 4 shows a schematic plane view of the main part of an ionization sputtering apparatus of the third mode.

Next will be described the third mode of the invention. FIG. 4 shows a schematic plane view of the main part of an ionization sputtering apparatus of the third mode. The third mode is also different in the composition of magnetic device 8. Magnetic device 8 in the third mode is one which applies a magnetic field orienting ionized sputtered particles to substrate 50. Specifically, magnetic device 8 in this mode comprises the first magnet 83 provided around the ionization space and the second magnet 84 provided beneath holder 51. The first magnet 83 is a ring-shaped permanent magnet surrounding the ionization space outside deposition shield 9. The surface of the first magnet 83 facing to deposition shield 9 (hereafter called "inside surface") is N pole, and the surface opposite to the inside surface (hereafter called is "outside surface") is S pole. The second magnet 84 is also ring-shaped permanent magnet which is coaxial with the center of substrate 50. The upper surface of the second magnet 84 is N pole and the bottom surface is S pole. With the described configuration of magnetic device 8, magnetic lines 85 shown in FIG. 4 are applied interconnecting the inside surface of the first magnet 83 and the upper surface of the second magnet 84. Those magnetic lines 85 reach at the surface of substrate 50 via the ionization space.

The sputtered particles ionized in the plasma at the ionization space are influenced by the extraction electric field as described. However, there is little chance that initial kinetic directions of sputtered particles are toward to substrate 50 when those sputtered particles are ionized. By the influence of the extraction electric field, the flying course of sputtered particles are curved to be oriented toward substrate 50 gradually. Magnetic lines 85 between the first magnet 83 and the second magnet 84 brings the effect to enhance this orientation. At a magnetic field, electrons and ions are captured by a magnetic line and tend to fly spirally around it. Therefore, when the sputtered particles are ionized, they are captured by magnetic line 85 and gyrate around it. Together with this gyration, they are oriented to fly toward substrate 50 by the extraction field. Because magnetic lines 85 are toward substrate 50, the flying course of ionized sputtered particles are curved more efficiently toward substrate 50. Therefore, the effect of the ionization sputtering is enhanced more. The described effect of magnetic device 85 is still the same, in case the inside surface of the first magnet 83 is N pole and the upper surface of the second magnet 84 is S pole. What is necessary is only that poles dissimilar to each other appear at both sides of the ionized space.

Magnetic device 8 in the third mode also has the prevention function of the plasma diffusion from the ionization space. Magnetic lines 85 from the ionization space to the first magnet 83 are collected in the vicinity of the first magnet 83. They are more dense at positions more adjacent to the first magnets 83. Therefore, the high-density plasma is maintained at the ionization space because charged particles turn back to the plasma as well as in the first and second mode. The inventors measured the ionization efficiency in the apparatus of the third mode. It was turned out to be about 80%.

It is possible that the first magnet 83 is modified to be the first magnet group or the second magnet 84 is modified to be the second magnet group. The first magnet group may be the same composition as the group of permanent magnets 81 in the first mode or the group of electromagnets 82 in the second mode. As the second magnet group, it is preferable to employ the arrangement where the same number of permanent magnets or electromagnets as the first group are provided on a coaxial circle with the same distance from each other.

Figure 5:
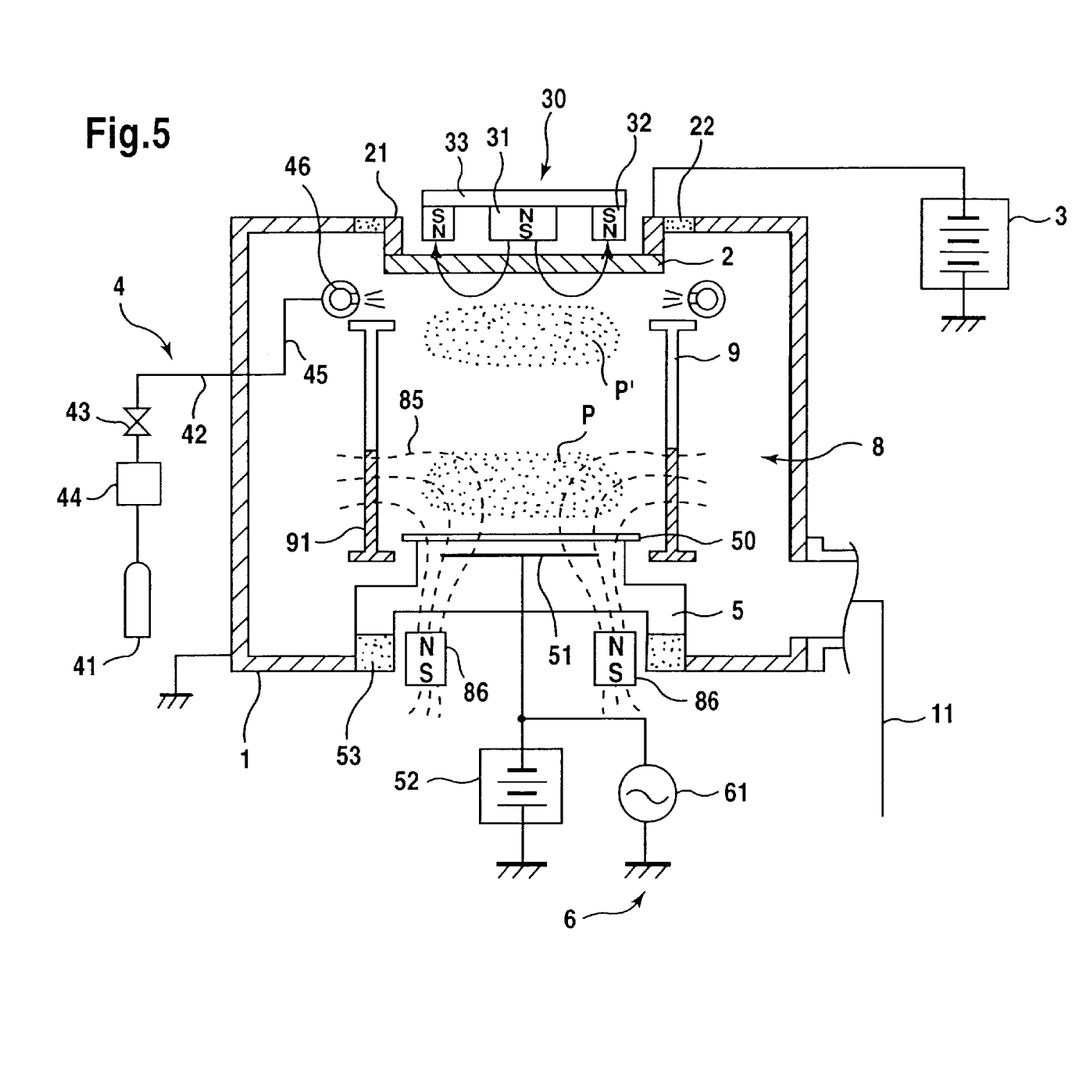
FIG. 5 shows a schematic front view of an ionization sputtering apparatus of the forth mode.

Next will be described the forth mode of the invention. FIG. 5 shows a schematic front view of an ionization sputtering apparatus of the forth mode. The apparatus of the forth mode is also different in the composition of magnet device 8. In this mode, a part of deposition shield 9 preventing sputtered particles from arriving at an unnecessary place is commonly used as a part of magnetic device 8. Specifically, lower half part 91 of deposition shield 9 is made of magnetic material. This part 91 is hereafter called "magnetic part." Magnetic part 91 is made of anti-corrosion iron such as nickel-plated iron. On the other hand, auxiliary magnet 86 which is the same as the second magnet 84 in the third mode is provided beneath holder 5. Magnetic part 91 on deposition shield 9 forms a magnet path for the magnetic field applied by auxiliary magnet 86 and is magnetized with time, composing magnetic device 8. Magnetic lines 87 between magnetic part 91 and auxiliary magnet 86 have the function to orient the ionized sputtered particles toward substrate 50 as well as in the third mode, enhancing the effect of the ionization sputtering. Magnetic lines 87 has the effect to preventing the plasma from diffusing from the ionization space because they are collected to be more dense at positions more adjacent to magnetic part 91.

Magnetic device 8 in the apparatus of the first mode as described also can be composed of parts of deposition shield 8. Specifically, this composition is enabled by making rectangular parallelepiped shaped magnetic piece or magnet in each hole. By giving the same arrangement as the group of permanent magnets 81 in the first mode with these magnetic pieces or magnets, the plasma diffusion prevention effect is obtained as well.

Figure 6:
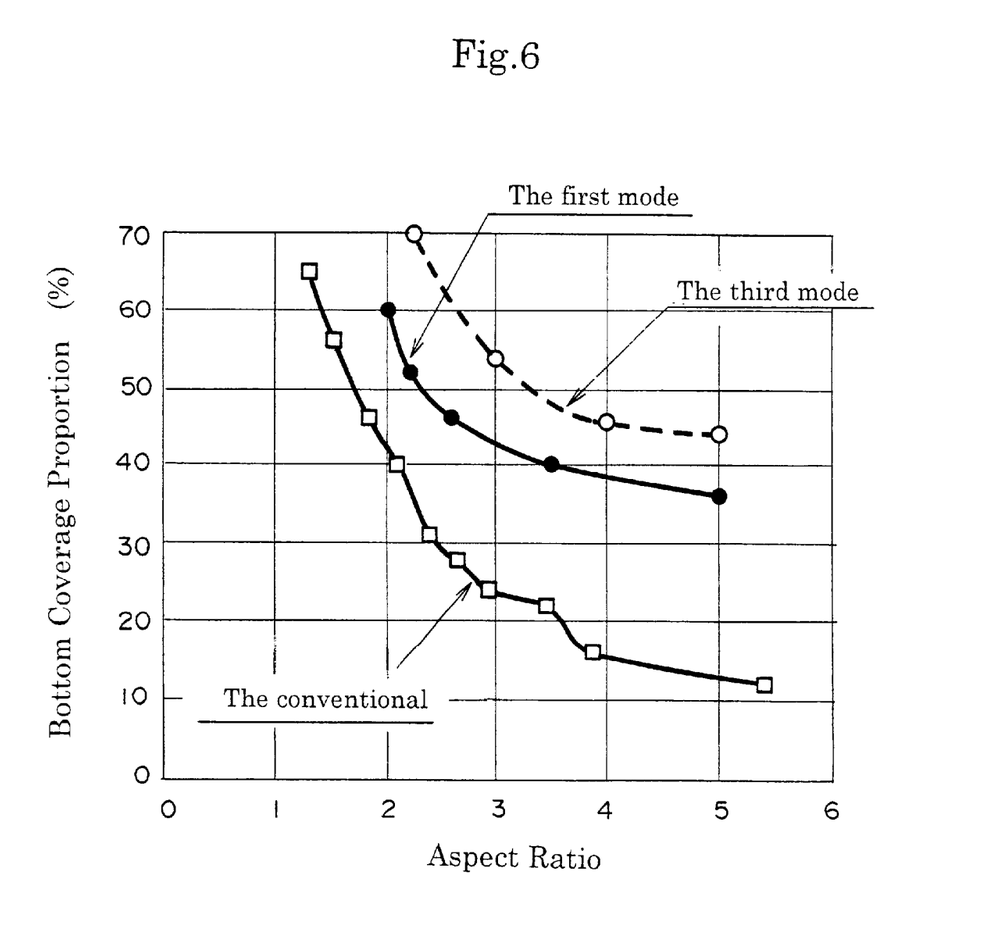
FIG. 6 shows bottom coverage on depositions by the first mode apparatus and the third mode apparatus.

As a more detailed embodiment, each apparatus of the described modes can be operated under a following condition.

process gas; argon flow rate of process gas; 100 cc per minute material of target 2; titanium input power to target 2; 4 kW pressure in sputter chamber 1; 30 mTorr RF source 61; 13.56 MHz, 200W FIG. 6 shows bottom coverage on depositions by the first mode apparatus and the third mode apparatus. A bottom coverage with a conventional sputtering apparatus is also shown in FIG. 6 for reference. In FIG. 6, ○ marker designates a bottom coverage with the first mode apparatus, ● marker designates one with the third mode apparatus and □ marker designates one with the conventional sputtering apparatus. As shown in FIG. 6, with both apparatuses of the first and the third mode, those two bottom coverages are much higher than the conventional sputtering apparatus. Specifically, in case of the deposition onto a hole with aspect ratio 5, the bottom coverage is 35% with the first mode and 40% with the third mode, contrarily to that it is not more than 12% with the conventional apparatus. These results prove that this invention is much effective for processes of next-generation devices such as 256 Mbit or more DRAM with aspect ratio higher than 4.

Though RF source 61 applying the RF voltage with holder 5 is used as ionization means 6 in the described modes, it is possible to employ an ionization means comprising a RF coil or antenna provided surrounding the ionization space and a RF source applying a RF voltage with the RF coil or antenna. A means generating a dc diode plasma, an electron cyclotron resonance (ECR) plasma or a helicon-wave plasma also can be employed as an ionization means. In a particular way, a sputter discharge can be sustained without introducing any gas. This is because sputtered particles are ionized in the plasma generated with the discharge and those ionized sputtered particles can solely sustain the discharge. When this type of sputtered discharge is utilized, gas introduction means 4 is not operated while the sputter deposition. In addition to processes of various kinds of semiconductor devices, the ionized sputtering apparatus of this invention is utilized for processes of liquid crystal displays and other electronics products. It should be noted that the word "hole" is not limited to either round or square shapes in this specification. The word "hole" includes an elongated shape, that is, "trench".

What is claimed is:

1. An ionization sputtering apparatus comprising:

a sputter chamber having a pumping system, a target provided in said sputter chamber, a substrate holder facing said target and spaced therefrom, a sputter source for bombarding said target to cause a sputter discharge, gas introduction means for introducing gas into said chamber, ionization means for ionizing sputtered particles from said target, said ionization means generating a plasma at a pressure of 10 mTorr to 100 mTorr at an ionization space between said target and said substrate holder, a magnetic device preventing said plasma from diffusing from said ionization space, and a deposition shield preventing said sputtered particles from arriving at an unnecessary place in said sputter chamber, said deposition shield being disposed within said chamber, said deposition shield being a cylinder surrounding a space between said target and said holder and being partially made of magnetic material to compose a part or whole of said magnetic device.

2. An ionization sputtering apparatus as claimed in claim 1, wherein said ionization means generates said plasma by applying radio frequency energy.

3. An ionization sputtering apparatus comprising:

a sputter chamber having a pumping system, a target provided in said sputter chamber, a substrate holder facing said target and spaced therefrom, a sputter source for bombarding said target to cause a sputter discharge, gas introduction means for introducing gas into said chamber, ionization means for ionizing sputtered particles from said target said ionization means generating a plasma at a pressure of 10 mTorr to 100 mTorr at an ionization space between said target and said substrate holder, and a magnetic device having a first magnet disposed around said ionization space and a second magnet disposed beneath said substrate holder, said magnetic device orienting said ionized sputtered particles toward said substrate, said magnetic device generating magnetic flux vertical to said substrate extending from said ionization space to said substrate.

4. An ionization sputtering apparatus as claimed in claim 3, wherein said magnetic device comprises a first magnet or group of magnets surrounding said ionization space and a second magnet or group of magnets provided beneath said holder so that magnetic lines are applied via said ionization space to said substrate.

5. An ionization sputtering apparatus as claimed in claim 4, wherein said first magnet or group of magnets prevents said plasma from diffusing from said ionization space.

6. An ionization sputtering apparatus as claimed in claim 3, further comprising a deposition shield preventing said sputtered particles from arriving at an unnecessary place in said sputter chamber, said deposition shield being a cylinder surrounding a space between said target and said holder and being partially made of magnetic material to compose a part or whole of said magnetic device.

7. An ionization sputerring apparatus as claimed in claim 3, wherein said ionization means generates said plasma by applying radio frequency energy.

8. An ionization sputtering apparatus as claimed in claim 3, further comprising a deposition shield preventing said sputtered particles from arriving at an unnecessary place in said sputter chamber, said deposition shield being a cylinder surrounding a space between said target and said holder and being partially made of a magnet to compose a part or whole of said magnetic device.

9. An ionization sputtering apparatus comprising:

a sputter chamber having a pumping system, a target provided in said sputter chamber, a substrate holder facing said target and spaced therefrom, a sputter source for bombarding said target to cause a sputter discharge, gas introduction means for introducing gas into said chamber, ionization means for ionizing sputtered particles from said target, said ionization means generating a plasma at a pressure of 10 mTorr to 100 mTorr at an ionization space between said target and said substrate holder, a magnetic device preventing said plasma from diffusing from said ionization space, and a deposition shield preventing said sputtered particles from arriving at an unnecessary place in said sputter chamber, said deposition shield being disposed within said chamber, said deposition shield being a cylinder surrounding a space between said target and said holder and being partially made of a magnet to compose a part or whole of said magnetic device.

10. An ionization sputtering apparatus as claimed in claim 9, wherein said ionization means generates said plasma by applying radio frequency energy.

\* \* \* \* \*